(12) United States Patent
Dawson et al.

(10) Patent No.: US 10,884,387 B2
(45) Date of Patent: Jan. 5, 2021

(54) SYSTEM AND METHOD TO DYNAMICALLY CHANGE DATA CENTER PARTITIONS

(71) Applicant: INTERNATIONAL BUSINESS MACHINES CORPORATION, Armonk, NY (US)

(72) Inventors: Christopher J. Dawson, Arlington, VA (US); Vincenzo V. Diluoffo, Sandy Hook, CT (US); Rick A. Hamilton, II, Charlottesville, VA (US); Michael D. Kendzierski, New York, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 174 days.

(21) Appl. No.: 15/842,948

(22) Filed: Dec. 15, 2017

(65) Prior Publication Data

US 2018/0107183 A1      Apr. 19, 2018

Related U.S. Application Data

(63) Continuation of application No. 14/621,873, filed on Feb. 13, 2015, now Pat. No. 9,939,796, which is a
(Continued)

(51) Int. Cl.
*G05B 19/04*      (2006.01)
*F24F 11/00*      (2018.01)
(Continued)

(52) U.S. Cl.
CPC .......... *G05B 19/04* (2013.01); *F24F 11/0001* (2013.01); *G05D 23/193* (2013.01);
(Continued)

(58) Field of Classification Search
CPC ................................................... F24F 2221/40
(Continued)

(56) References Cited

U.S. PATENT DOCUMENTS 2,751,198 A    6/1956   Rapp
3,516,347 A    6/1970   May
(Continued)

FOREIGN PATENT DOCUMENTS

EP            614088 A1    9/1994

OTHER PUBLICATIONS

IBM, "Dynamic Thermal Mapping and Trend Analysis as a Control Mechanism for HVAC Systems in Data Centers" Mar. 27, 2006, 2 pgs (Year: 2006).*
(Continued)

*Primary Examiner* — Emilio J Saavedra
(74) *Attorney, Agent, or Firm* — Stephanie Carusillo; Andrew M. Calderon; Roberts Calderon Safran & Cole, P.C.

(57) ABSTRACT

A method implemented in a computer infrastructure having computer executable code tangibly embodied on a computer readable medium being operable to perform a thermal analysis of a data center and overlay the thermal analysis on a map of the data center to provide an overlaid thermal analysis. Additionally, the computer executable code is operable to dynamically control at least one partition in the data center based on the overlaid thermal analysis.

20 Claims, 4 Drawing Sheets

Related U.S. Application Data continuation of application No. 12/240,016, filed on Sep. 29, 2008, now Pat. No. 8,983,675.

(51) Int. Cl.
  *H05K 7/20* (2006.01)
  *G05D 23/19* (2006.01)

(52) U.S. Cl.
  CPC ..... *G05D 23/1917* (2013.01); *G05D 23/1932* (2013.01); *H05K 7/20745* (2013.01); *G05B 2219/2614* (2013.01)

(58) Field of Classification Search
  USPC .......................................................... 700/276
  See application file for complete search history.

(56) References Cited

U.S. PATENT DOCUMENTS

| | | | |
|---|---|---|---|
| 3,675,023 | A * | 7/1972 | Kunke .................. G01J 1/42 250/338.1 |
| 3,690,243 | A | 9/1972 | Lambert |
| 3,690,370 | A | 9/1972 | Piper |
| 3,750,366 | A | 8/1973 | Rich et al. |
| 3,757,666 | A | 9/1973 | Lambert |
| 3,798,839 | A | 3/1974 | Kaufman |
| 3,835,606 | A | 9/1974 | Liberman |
| 3,900,063 | A | 8/1975 | Roller |
| 3,986,850 | A | 10/1976 | Wilcox |
| 4,034,524 | A | 7/1977 | Fromme et al. |
| 4,285,390 | A | 8/1981 | Fortune et al. |
| 4,353,411 | A | 10/1982 | Harter et al. |
| 4,646,500 | A | 3/1987 | Smith |
| 4,783,943 | A | 11/1988 | Ljungkvist |
| 4,931,948 | A | 6/1990 | Parker et al. |
| 4,947,928 | A | 8/1990 | Parker et al. |
| 4,996,810 | A | 3/1991 | Forde |
| 5,107,687 | A | 4/1992 | Candeloro |
| 5,165,465 | A | 11/1992 | Kenet |
| 5,167,575 | A | 12/1992 | MacDonald |
| 5,189,606 | A | 2/1993 | Burns et al. |
| 5,263,289 | A | 11/1993 | Boyd |
| 5,309,146 | A | 5/1994 | Kenet |
| 5,394,324 | A | 2/1995 | Clearwater |
| 5,467,607 | A | 11/1995 | Harvey |
| 5,477,698 | A | 12/1995 | Takegawa et al. |
| 5,490,357 | A | 2/1996 | Lin |
| 5,544,036 | A | 8/1996 | Brown et al. |
| 5,778,612 | A | 7/1998 | Kissinger et al. |
| 5,796,952 | A | 8/1998 | Davis et al. |
| 5,842,313 | A | 12/1998 | Murray et al. |
| 5,992,108 | A | 11/1999 | Falcey |
| 6,003,273 | A | 12/1999 | Elsholz et al. |
| 6,033,301 | A | 3/2000 | Suwa |
| 6,134,511 | A | 10/2000 | Subbarao |
| 6,202,360 | B1 | 3/2001 | Rattner et al. |
| 6,251,006 | B1 * | 6/2001 | Laborde .................. F24F 9/00 454/189 |
| 6,318,113 | B1 | 11/2001 | Levy et al. |
| 6,385,510 | B1 | 5/2002 | Hoog et al. |
| 6,557,624 | B1 | 5/2003 | Stahl et al. |
| 6,604,993 | B1 | 8/2003 | Boniface |
| 6,711,470 | B1 | 3/2004 | Hartenstein et al. |
| 6,718,277 | B2 | 4/2004 | Sharma |
| 6,741,967 | B1 | 5/2004 | Wu et al. |
| 6,832,490 | B2 | 12/2004 | Bash et al. |
| 6,862,179 | B2 | 3/2005 | Beitelmal et al. |
| 6,885,115 | B2 | 4/2005 | Hatori et al. |
| 6,991,533 | B2 | 1/2006 | Tsai et al. |
| 6,996,940 | B2 | 2/2006 | Beasley |
| 7,010,392 | B2 | 3/2006 | Bash et al. |
| 7,214,131 | B2 | 5/2007 | Malone |
| 7,228,664 | B2 | 6/2007 | Clark |
| 7,259,963 | B2 | 8/2007 | Germagian et al. |
| 7,266,964 | B2 | 9/2007 | Vogel et al. |
| 7,304,477 | B2 | 12/2007 | Konijn et al. |
| 7,676,280 | B1 * | 3/2010 | Bash .................. H05K 7/20836 700/17 |
| 7,856,370 | B2 | 12/2010 | Katta et al. |
| 8,090,476 | B2 | 1/2012 | Dawson et al. |
| 2001/0032062 | A1 | 10/2001 | Plaskoff et al. |
| 2001/0034987 | A1 | 11/2001 | Cooper et al. |
| 2002/0093538 | A1 | 7/2002 | Carlin |
| 2002/0174223 | A1 | 11/2002 | Childers et al. |
| 2002/0189180 | A1 | 12/2002 | King et al. |
| 2003/0066252 | A1 * | 4/2003 | Rejc .................... E06B 9/11 52/173.2 |
| 2003/0067745 | A1 | 4/2003 | Patel et al. |
| 2003/0085033 | A1 | 5/2003 | Petterson |
| 2003/0097806 | A1 | 5/2003 | Brown |
| 2003/0158718 | A1 | 8/2003 | Nakagawa et al. |
| 2003/0200050 | A1 * | 10/2003 | Sharma .................. F24F 11/62 702/132 |
| 2003/0224717 | A1 | 12/2003 | Tsai et al. |
| 2004/0035074 | A1 | 2/2004 | Stanescu et al. |
| 2004/0109288 | A1 * | 6/2004 | Beitelmal .............. F25D 17/06 361/679.53 |
| 2004/0183904 | A1 | 9/2004 | Johnson |
| 2004/0187401 | A1 | 9/2004 | Krestakos et al. |
| 2004/0236528 | A1 | 11/2004 | Steinkircherner et al. |
| 2005/0043907 | A1 | 2/2005 | Eckel et al. |
| 2005/0159099 | A1 | 7/2005 | Malone |
| 2005/0183353 | A1 | 8/2005 | Haberman |
| 2005/0267639 | A1 | 12/2005 | Sharma et al. |
| 2005/0288812 | A1 | 12/2005 | Cheng et al. |
| 2006/0015712 | A1 | 1/2006 | Ang et al. |
| 2006/0015866 | A1 | 1/2006 | Ang et al. |
| 2006/0021375 | A1 * | 2/2006 | Wetzel .................. F24F 3/161 62/419 |
| 2006/0073783 | A1 | 4/2006 | Tsai et al. |
| 2006/0076425 | A1 | 4/2006 | Demster |
| 2006/0100912 | A1 | 5/2006 | Kumar et al. |
| 2006/0168975 | A1 * | 8/2006 | Malone .............. H05K 7/20836 62/180 |
| 2006/0250770 | A1 | 11/2006 | Campbell et al. |
| 2006/0250970 | A1 | 11/2006 | Gao et al. |
| 2006/0260338 | A1 | 11/2006 | VanGilder et al. |
| 2007/0019380 | A1 | 1/2007 | Campbell et al. |
| 2007/0032979 | A1 | 2/2007 | Hamann et al. |
| 2007/0038414 | A1 | 2/2007 | Rasmussen et al. |
| 2007/0062685 | A1 | 3/2007 | Patel et al. |
| 2007/0080689 | A1 | 4/2007 | Konijn et al. |
| 2007/0089446 | A1 | 4/2007 | Larson et al. |
| 2007/0108307 | A1 | 5/2007 | Sinclaire |
| 2007/0125107 | A1 | 6/2007 | Beam |
| 2007/0146994 | A1 | 6/2007 | Germagian et al. |
| 2007/0174024 | A1 | 7/2007 | Rasmussen et al. |
| 2007/0213000 | A1 | 9/2007 | Day |
| 2008/0080591 | A1 | 4/2008 | Tanaka et al. |
| 2008/0120069 | A1 | 5/2008 | Martin et al. |
| 2008/0269932 | A1 * | 10/2008 | Chardon .............. G06T 11/206 700/98 |
| 2009/0012633 | A1 | 1/2009 | Liu et al. |
| 2009/0132699 | A1 | 5/2009 | Sharma et al. |
| 2009/0138313 | A1 | 5/2009 | Morgan et al. |
| 2009/0150129 | A1 | 6/2009 | Archibald et al. |
| 2009/0205416 | A1 | 8/2009 | Campbell et al. |
| 2009/0265568 | A1 * | 10/2009 | Jackson ................ G06F 1/3203 713/320 |
| 2009/0326879 | A1 | 12/2009 | Hamann et al. |
| 2009/0326884 | A1 | 12/2009 | Amemiya et al. |
| 2010/0057259 | A1 | 3/2010 | Dawson et al. |
| 2010/0094645 | A1 | 4/2010 | Carroll et al. |
| 2011/0239013 | A1 | 9/2011 | Muller |

OTHER PUBLICATIONS

Ferrer et al., "Data Center Thermal Zone Mapping: An innovative visualization tool for thermal metric analysis" Sep. 2007, 10 pgs., (Year: 2007).*

Nielsen, Capture Index Defined, 2019, StruxureWare for Data Centers and NetBotz, pp. 1-2 (Year: 2018).

(56) References Cited

OTHER PUBLICATIONS

Office Action dated Feb. 6, 2019 in related U.S. Appl. No. 14/988,860, 39 pages.
Final Office Action in related U.S. Appl. No. 14/988,860 dated Jun. 29, 2018, 48 pages.
Schmidt et al., "Challenges of Data Center Thermal Management" IEEE, 2005, 15 pages.
Moore et al.,"ConSil: Low-Cost Thermal Mapping of Data Centers", Jun. 2006, HP white paper, 5 pages.
IBM, "Dynamic Thermal Mapping and Trend Analysis as a Control Mechanism for HVAC System in Data Center", 2006, 3 pages.
Alex Frangos; "Raised-Floor Ventilation Gains Footing in Offices"; URL: http://www.realestatejournal.com/propertyreport/office/20030714-frangos.html; pp. 1-2; Jul. 14, 2004.
Kevin Epstein, et al.; "Double Jeopardy in a 'Slow' Disaster Computing Data Center Challenges in a Pandemic World"; URL: http://www.scalent.com/html/company/News/drj_spring07.pdf?item=21900; Spring 2006; pp. 50-51.
Ron Anderson; Increased power and cooling requirements are creating intensified demand for data-center redesigns; URL: http://i.cmpnet.com/v3.businessinnovation.cmp.com/pdfs/nwca_datacenter_report.pdf ; Aug. 2006; pp. 1-24.
Mulay et al., "Computational Study of Hybrid Cooling Solution for Thermal Management of Data Center", 2007, Proceedings of IPACK2007, 9 pages.
Boucher et al., "Viability of Dynamic Cooling Control in a Data Center Environment", IEEE, 2004, pp. 593-600.
Karlsson et al., "Investigation of Indoor Climate and Power Usage in a Data Center", 2004, Elsevier, Linkoping University, Linkoping Sweden, 1075-1083.
Booty-F., "Workplace Facilities", 2006, Facility Management Handbook, 143-166.
"Flow Modeling Solutions for Data Centers"; URL: http://www.fluent.com/solutions/data_centers/index.htm; p. 1 (no date).
"Data Center Cooling, Server Room Cooling & Rack Cooling Solutions"; URL: http://www.42u.com/42u-rack-cooling.htm; pp. 1-3 (no date).
http://www.tateaccessfloors.com/documentation_green.htm; pp. 1-2 (no date).
Tashtoush et al., "Dynamic model of an HVAC system for control analysis", 2005, Elsevier, pp. 1729-1745.
Chiang et al., "Integration of Supervisory and Nonlinear Control for a Heating, Ventilating, and Air Conditioning System", Apr. 2005, IEEE, pp. 544-549.
Office Action dated Sep. 3, 2019 in related U.S. Appl. No. 14/988,860, 42 pages.
Final Office Action dated Mar. 24, 2020 in related U.S. Appl. No. 14/988,860, 59 pages.
PTS Data Center Solutions, Data Center Floor Plans, Apr. 2007, PTS Data Center Solutions, pp. 1-7 (Year: 2007).

* cited by examiner

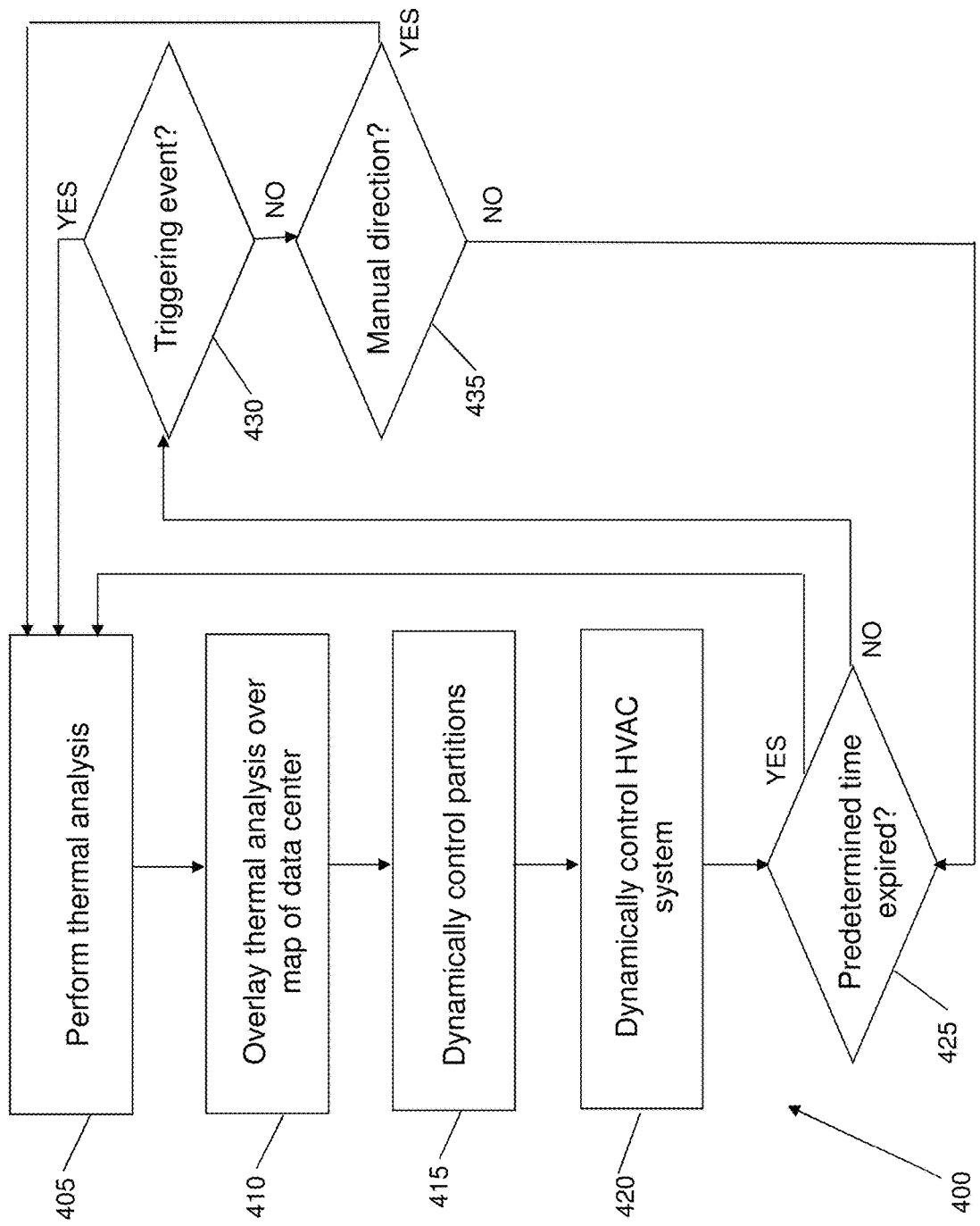

SYSTEM AND METHOD TO DYNAMICALLY CHANGE DATA CENTER PARTITIONS

FIELD OF THE INVENTION

The present invention generally relates to data centers, and more particularly, to a method and system implemented in a computer infrastructure to detect data center conditions and dynamically change the physical partitions of a data center through the use of moveable ceiling, floor and/or wall configurations.

BACKGROUND

A traditional data center conventionally includes a plurality of individual computing resources in one open area having four exterior walls. A data center (or other physical space) beneficially has, where possible, an optimized heating and cooling infrastructure. Maintaining data centers at desired temperatures (e.g., set points) helps prevent computer hardware (e.g., IT infrastructure) from overheating and malfunctioning. To this end, many data centers are cooled to relatively low temperatures (e.g., 65° F.) to increase equipment reliability and useful life, and to avoid downtime for repair and/or replacement.

Current climate control systems are largely inefficient. The airflow of a data center is normally regulated by the amount of equipment and heat that is generated by the individual computing resources. Data centers typically have hot spots where IT equipment operates. That is, due to, e.g., the locations of the individual computing resources within the data center, there may be regions of higher temperatures and regions of cooler temperatures in the data center. However, conventional cooling systems cool the entire data center to a temperature well below the set point so that IT equipment operating in the hot spots does not exceed the set point. This increases operational costs and wastes energy.

Moreover, data center hot spots are routinely changing location, depending on which IT equipment is running at any given time. For example, some IT infrastructure in a first area of the data center may run during the day, while other IT infrastructure at a different area of the data center may operate at night. To accommodate such moving hot spot targets, existing systems resort to a sort of 'overkill' by cooling the entire volume of the data center to well below the set point, which increases operational costs. Moreover, with the increasing awareness and desire to operate in a green manner, such excessive use of energy is undesirable.

Furthermore, as, e.g., a rack of computers produce hot air, this hot air will normally be drawn to cooler temperature regions of the data center. This diffusion of the hot air to the cooler temperature regions of the data center adds to the load of cooling air that the heating, ventilation and air conditioning (HVAC) units must produce. Increasing the load on the HVAC units, in turn, increases the costs of operating the data center.

Accordingly, there exists a need in the art to overcome the deficiencies and limitations described hereinabove.

SUMMARY

In a first aspect of the invention, a method implemented in a computer infrastructure having computer executable code tangibly embodied on a computer readable medium is operable to perform a thermal analysis of a data center and overlay the thermal analysis on a map of the data center to provide an overlaid thermal analysis. Additionally, the method comprises dynamically controlling at least one partition in the data center based on the overlaid thermal analysis.

In another aspect of the invention, a system comprises a thermal analysis tool configured to perform a thermal analysis of a data center and a mapping tool configured to overlay the thermal analysis over a map of the data center to provide an overlaid thermal analysis. Additionally, the system comprises a partition control tool configured to dynamically control a partition in the data center based on the overlaid thermal analysis.

In an additional aspect of the invention, a computer program product comprising a computer usable medium having readable program code embodied in the medium is provided. The computer program product includes at least one component operable to perform a thermal analysis of a data center by receiving real-time temperature readings from at least one temperature sensor in the data center and at least one of determine average temperatures for regions of the data center based on the real-time temperature readings and determine air flow paths in the data center. Additionally, the at least one component is operable to overlay the thermal analysis on a map of the data center to provide an overlaid thermal analysis. Further, the at least one component is operable to dynamically control at least one partition in the data center based on the overlaid thermal analysis and dynamically control an HVAC system based on the overlaid thermal analysis and a location of the at least one partition.

In a further aspect of the invention, a method comprises providing a computer infrastructure operable to perform a thermal analysis of a data center to identify cooler regions of the data center and hotter regions of the data center and overlay the thermal analysis on a map of the data center to provide an overlaid thermal analysis which correlates the cooler regions of the data center and the hotter regions of the data center with computational resources of the data center. Additionally, the computer infrastructure operable to dynamically control at least one partition in the data center based on the overlaid thermal analysis and dynamically control an HVAC system based on the overlaid thermal analysis and a location of the at least one partition.

BRIEF DESCRIPTION OF THE SEVERAL VIEWS OF THE DRAWINGS

The present invention is described in the detailed description which follows, in reference to the noted plurality of drawings by way of non-limiting examples of exemplary embodiments of the present invention.

FIG. 4 shows a flow diagram for implementing aspects of the present invention.

DETAILED DESCRIPTION

The present invention generally relates to data centers, and more particularly, to a method and system implemented in a computer infrastructure to detect data center conditions and dynamically change the physical partitions of a data center through the use of moveable ceiling, floor and/or wall configurations. The present invention is able to dynamically create partitions within the data center between, for example, the walkways and the information technology (IT) infrastructure. Moreover, the partitions may be used within the data center to, e.g., concentrate cooling capacity and air flow to an area of the data center where a job is scheduled and, e.g., close off areas of the data center not being utilized.

By implementing the present invention, improved airflow and better managed temperature distributions within the data center may be achieved. Moreover, by dynamically aligning the wall partitions to maximize airflow through the data center, the data center can better utilize its power and cooling resources. With a more dynamic data center, through reconfigurable walls, ceilings and/or partitions, the cooler air, for example, may be circulated between parts of the data center that need it, e.g., data center hot spots, and thereby reducing the strain on the HVAC units to produce cooler air for the entire data center. This will allow the data center to maximize cool air within the data center and shield the important computing systems from hot air. This will also protect important computing resources from dangerous hot spots by regulating the hot air within the data center to areas that may be controlled through the use of the dynamic walls, partitions and/or ceilings.

Additionally, implementing the present invention will reduce the amount of energy consumed by the data center HVAC system, thereby increasing the efficiency of the data center. By using a system of dynamically configurable ceilings, walls and/or partitions, the energy efficiency of the data center will be improved to reduce the power and strain on cooling the air in certain parts of the data center. Furthermore, the present invention will reduce the costs to cool the data center and may lengthen the mean-time to failure for critical systems that are affected by changes in heat, temperature and humidity.

System Environment

Figure 1:
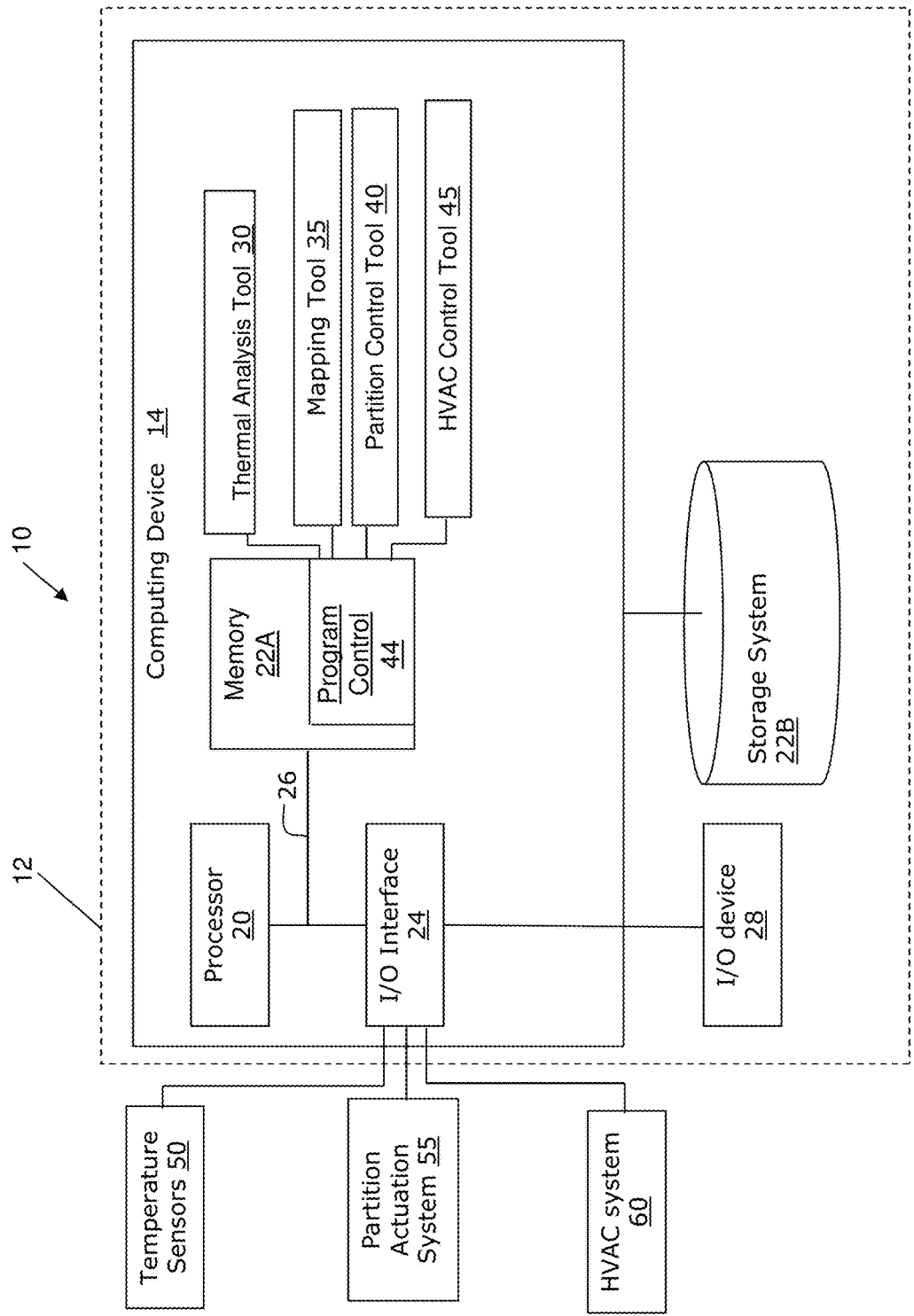
FIG. 1 shows an illustrative environment for implementing steps in accordance with the invention.

FIG. 1 shows an illustrative environment 10 for managing the processes in accordance with the invention. To this extent, the environment 10 includes a computer infrastructure 12 that can perform the processes described herein using a computing device 14. The computing device 14 includes a thermal analysis tool 30, a mapping tool 35, a partition control tool 40 and a heating, ventilation and air conditioning (HVAC) control tool 45. These tools are operable to perform a thermal analysis of a data center, overlay the thermal analysis over a map of the data center, control the placement of partitions based on the overlaid thermal analysis and control the HVAC system based on the overlaid thermal analysis, e.g., the processes described herein.

The computing device 14 includes a processor 20, a memory 22A, an input/output (I/O) interface 24, and a bus 26. The memory 22A can include local memory employed during actual execution of program code, bulk storage, and cache memories which provide temporary storage of at least some program code in order to reduce the number of times code must be retrieved from bulk storage during execution.

Further, the computing device 14 is in communication with an external I/O device/resource 28. The I/O device 28 can interact with the computing device 14 or any device that enables the computing device 14 to communicate with one or more other computing devices using any type of communications link. The external I/O device/resource 28 may be keyboards, displays, pointing devices, etc. Additionally, in embodiments, the computing device 14 includes a storage system 22B. Moreover, as shown in FIG. 1 and explained further below, the computing device 14 is in communication with a plurality of temperature sensors 50, a partition actuation system 55 and an HVAC system 60.

The processor 20 executes computer program code (e.g., program control 44) processes on computer media, which is stored in memory 22A and/or storage system 22B. While executing computer program code, the processor 20 can read and/or write data to/from memory 22A, storage system 22B, and/or I/O interface 24. The bus 26 provides a communications link between each of the components in the computing device 14.

The computing device 14 can comprise any general purpose computing article of manufacture capable of executing computer program code installed thereon (e.g., a personal computer, server, handheld device, etc.). However, it is understood that the computing device 14 is only representative of various possible equivalent computing devices that may perform the processes described herein. To this extent, in embodiments, the functionality provided by the computing device 14 can be implemented by a computing article of manufacture that includes any combination of general and/or specific purpose hardware and/or computer program code. In each embodiment, the program code and hardware can be created using standard programming and engineering techniques, respectively.

Similarly, the computer infrastructure 12 is only illustrative of various types of computer infrastructures for implementing the invention. For example, in embodiments, the computer infrastructure 12 comprises two or more computing devices (e.g., a server cluster) that communicate over any type of communications link, such as a network, a shared memory, or the like, to perform the processes described herein. Further, while performing the processes described herein, one or more computing devices in the computer infrastructure 12 can communicate with one or more other computing devices external to computer infrastructure 12 using any type of communications link. The communications link can comprise any combination of wired and/or wireless links; any combination of one or more types of networks (e.g., the Internet, a wide area network, a local area network, a virtual private network, etc.); and/or utilize any combination of transmission techniques and protocols.

In embodiments, the invention provides a business method that performs the steps of the invention on a subscription, advertising, and/or fee basis. That is, a service provider, such as a Solution Integrator, could offer to perform the processes described herein. In this case, the service provider can create, maintain, deploy, support, etc., a computer infrastructure that performs the process steps of the invention for one or more customers. In return, the service provider can receive payment from the customer(s) under a subscription and/or fee agreement and/or the service provider can receive payment from the sale of advertising content to one or more third parties.

Thermal Analysis

According to an aspect of the invention, the thermal analysis tool 30 may be used to perform a thermal analysis of a data center. More specifically, a plurality of temperature sensors 50 may be located throughout the data center. In embodiments, the temperature sensors may be, for example, evenly spaced throughout the data center. Additionally, in embodiments, the temperature sensors may be located in known data center hot spots. Moreover, in embodiments, the temperature sensors may be located on the ceiling of the data center, the floor of the data center and/or the walls of the data center (e.g., at differing elevations in the walls of the data center).

The thermal analysis tool 30 may receive real-time temperature readings from the plurality of temperature sensors 50. In embodiments, the thermal analysis tool 30 may determine average temperatures for regions of the data center based on the real-time temperature readings from the plurality of temperature sensors 50. Moreover, based on the real-time temperature readings, the thermal analysis tool 30 can determine a thermal analysis of the data center. For example, the thermal analysis tool 30 can determine regions of the data center that are very hot and regions of the data center that are very cool. Moreover, the thermal analysis tool 30 can determine air flow paths, e.g., hot air flow paths, based on the real-time temperature readings from the plurality of temperature sensors 50. Additionally, the thermal analysis tool 30 may access a job schedule (e.g., stored in storage system 22B), such that the thermal analysis tool 30 is aware of scheduled jobs for the different computing resources of the data center.

According to a further aspect of the invention, the mapping tool 35 may overlay the thermal analysis results obtained from the thermal analysis tool 30 to a map of the data center, e.g., a floor plan view. In embodiments, the map of the data center may include a physical layout of the data center's computing resources, including the locations of computing resources in the data center, as well as an indication as to whether, for example, a portion of computing resources should be maintained in a cool environment and/or a portion of the computing resources can operate in higher temperature environments. Using the floor plan view with the overlaid thermal analysis, the mapping tool 35 can determine those regions of the data center that may benefit from the partitions.

Figure 2:
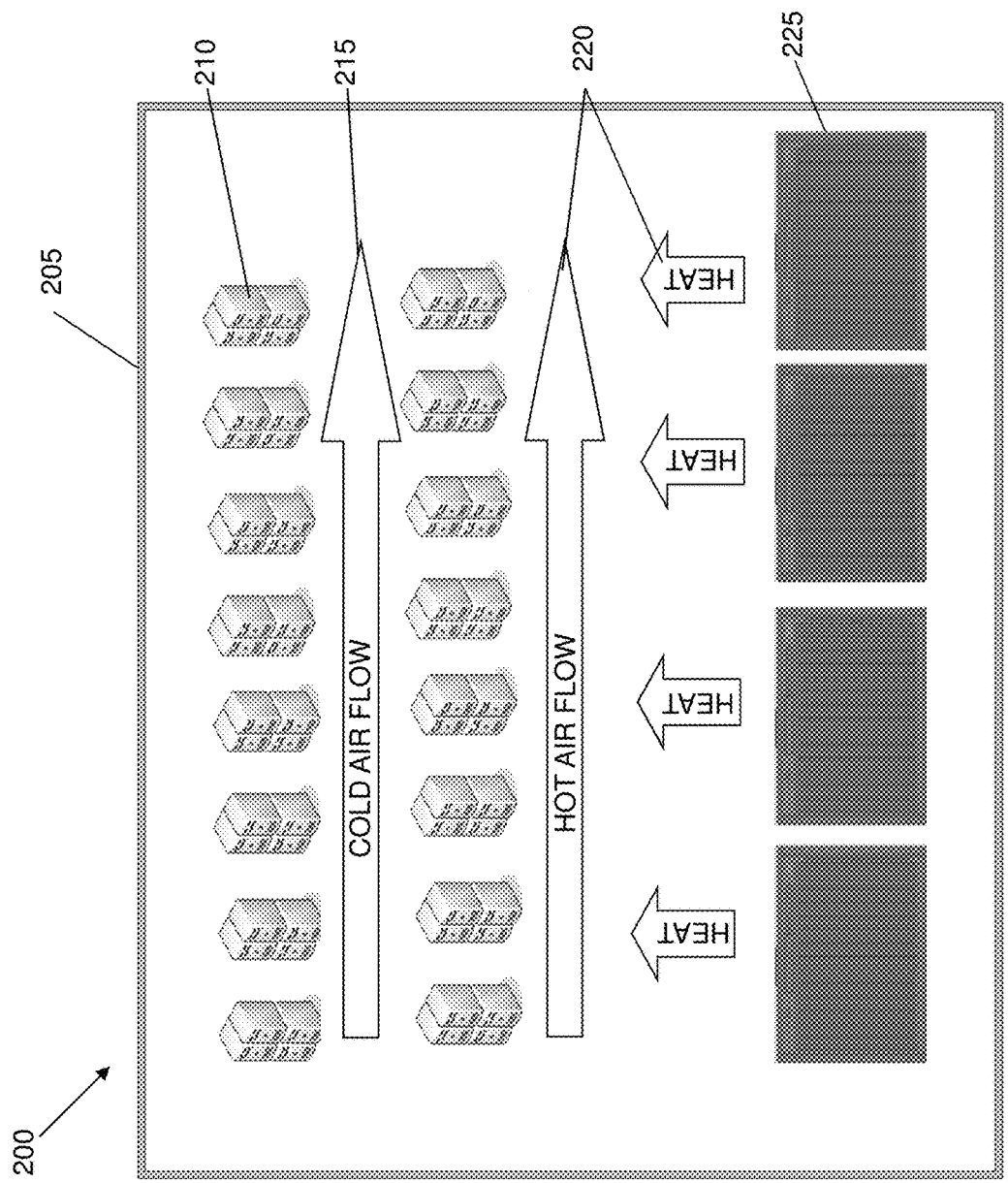
FIG. 2 shows an exemplary thermal analysis of a data center in accordance with the invention.

FIG. 2 shows an exemplary overlaid thermal analysis 200 according to an aspect of the invention. As shown in FIG. 2, a data center 205 contains, for example, computing equipment 210 that should be maintained at a cooler temperature and computing equipment 225 that may be less sensitive to higher temperatures. Additionally, using the mapping tool 35, FIG. 2 shows an a thermal analysis overlaid over a map of the data center, such that the overlaid thermal analysis 200 indicates hot air flows 220 and cold air flow 215 within the data center 205. Moreover, as can be determined from the overlaid thermal analysis 200, the computing equipment 225 is generating heat 220 that is flowing towards computing equipment 210, which, e.g., should be maintained at cooler temperatures.

It should be understood that, in embodiments, in addition to (or as an alternative to) the mapping tool 35 utilizing a floor plan view of the data center 205 as explained above, the mapping tool 35 may utilize other views of the data center 205, e.g., an elevation plan, in providing the overlaid thermal analysis. Moreover, while the floor plan view may be especially useful for the placement of vertical partitions, it should be understood that the elevation views may be especially useful for the placement of horizontal partitions. That is, the mapping tool 35 may map a thermal analysis over an elevation view, such that cooler or hotter regions (detected by the thermal analysis tool 30) of the data center may identified relative to a vertical axis of the data center. Additionally, the mapping tool 35 may use this overlaid thermal analysis to direct the partition control tool 40 to control a horizontal partition e.g., a dropped ceiling partition or a raised floor partition, to, e.g., adjust air flow patterns in the data center.

Data Center Partitions

According to a further aspect of the invention, the mapping tool 35 may utilize the overlaid thermal analysis 200 to determine one or more locations for data center partitions, such that, for example, those regions of the data center that should be maintained at a cooler temperature may be thermally separated from those regions of the data center that, e.g., may require less cooling.

Additionally, according to an aspect of the invention, the mapping tool 35, based on the overlaid thermal analysis, may instruct the partition control tool 40 to dynamically change partitions within the data center, such that the airflow can be dynamically changed to, e.g., shield computing resources from hot-spots within the data center. In embodiments, by, for example, enclosing or semi-enclosing the computing resources with the partitions, the efficiency of the HVAC units will be improved overall and the temperatures may be better controlled.

Figure 3:
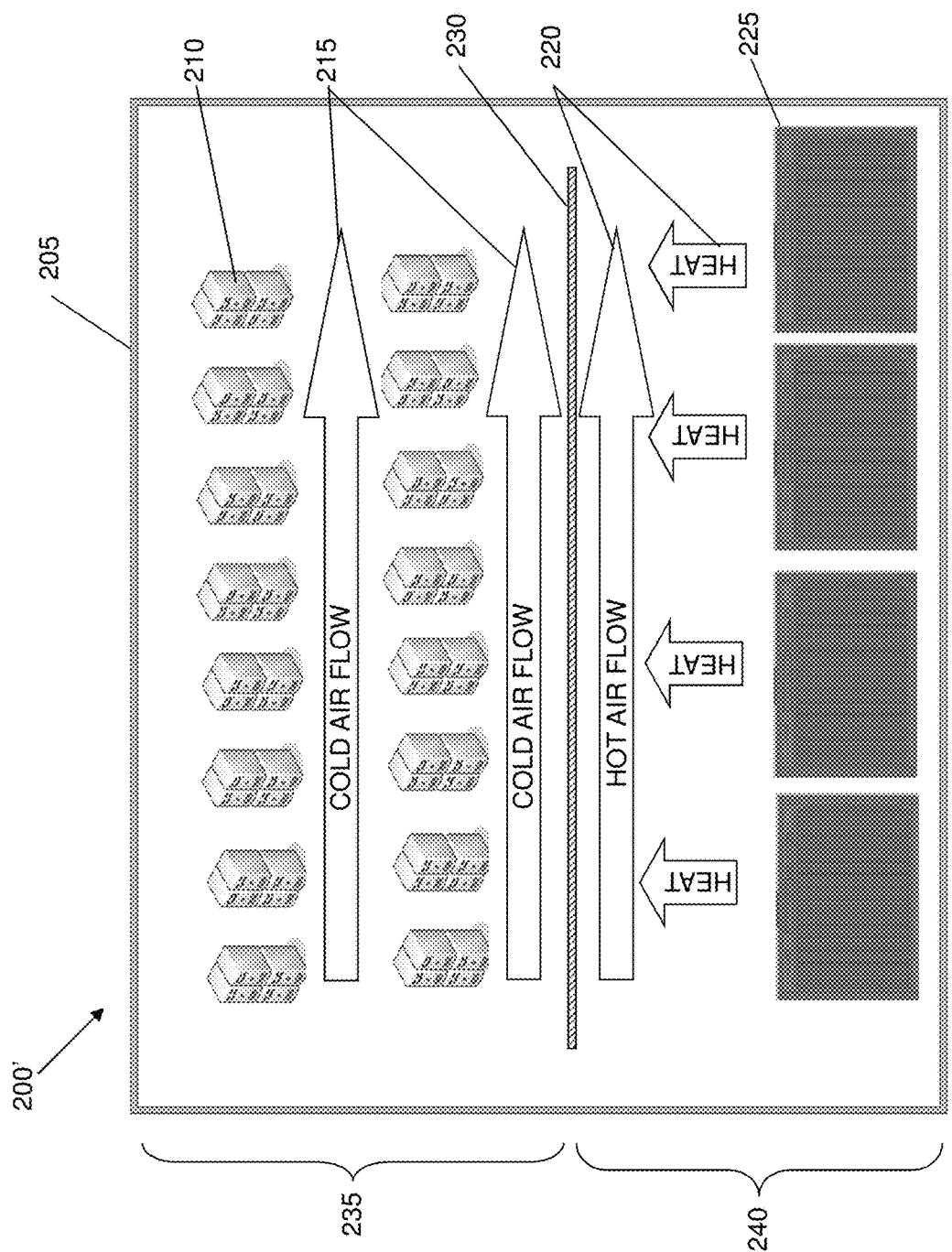
FIG. 3 shows an exemplary updated thermal analysis of a data center in accordance with the present invention.

FIG. 3 shows an exemplary overlaid thermal analysis 200' according to an aspect of the invention. More specifically, FIG. 3 illustrates an overlaid thermal analysis 200' of the data center 205 of FIG. 2 subsequent to the partition control tool 40 positioning a partition 230 in the data center to dynamically change the data center airflow. As shown in FIG. 3, subsequent to the partition control tool 40 positioning a partition 230 in the data center, the data center airflow has been changed due to the partition 230.

More specifically, those computing devices 210 which should be maintained at a cooler temperature have been isolated from those computing devices 225 that are less susceptible to higher temperatures. As such, the hot air flow 220 produced by the computing devices 225 is contained within a hotter region 240 of the data center 205 and does not flow to the cooler region 235 of the data center 205. Moreover, the cold air flow 215 is now restricted to the cooler region of the data center. Thus, as shown in FIG. 3, the partitions may provide a two-fold advantage. First, the hot air flow 220 is restricted to the hot region 235 of the data center 205, such that the hot air flow 220 does not increase temperatures in the cool region 235 of the data center 205. As the hot air flow 220 does not increase temperatures in the cool region 235, a load on the HVAC system is reduced. Moreover, a load on the HVAC system is also reduced, as the HVAC system is producing a cold air flow 215 to cool a smaller volume of the data center, e.g., the cool region 235.

In embodiments, the partitions may comprise a plurality of dynamically reconfigurable drop-down partitions, ceilings and floors. That is, while the exemplary partition 230 as shown in FIG. 3 is a single vertical partition, the invention contemplates that the partition may be a plurality of partitions. Further, the invention contemplates that the partition may also be a horizontal partition, e.g., a dropped ceiling partition and/or a raised floor partition, or may be arranged at some angle between the horizontal and the vertical, depending on the configuration of the data center 205. Moreover, in embodiments, for example, the partitions may spaced throughout the data center for activation by the partition control tool 45. Additionally, the partitions may be selectively positioned after conducting, e.g., an initial thermal analysis of the data center 205 to establish a baseline thermal analysis of the data center 205.

In embodiments, a partition may be held on a retractable spool (similar to a retractable movie screen) and may be unwound from the spool for placement within the data center. In further embodiments, the partition may be a folding retractable wall. Additionally, the partition may comprise lowered ceiling tiles and/or a raised flooring. In embodiments, the partition may be automatically controlled by the partition control tool 40 and deployed using the partition actuation system 55. In embodiments, the partition actuation system 55 may comprise appropriate motors and controls, e.g., servo motors, as would readily be understood by one of ordinary skill in the art. Additionally, in further embodiments, the partitions may be manually actuated, for example, by a data center employee, e.g., pulling down a retractable partition.

Moreover, in embodiments, the partition control tool 40 may indicate which partitions should be, e.g., extended into position, without automatically positioning the partition using the partition actuation device 55. For example, the partitions may include a signaling system, e.g., a light, which indicates to, e.g., a data center employee that a particular partition should be deployed.

Additionally, in embodiments, the partitions may be, for example, permanently or semi-permanently installed in the data center, such that, e.g., when the partitions are not in use they are stored in, e.g., the walls, the ceiling and/or the floor. However, the invention contemplates that all or a portion of the partitions may be installed as needed, for example by placing the partitions on pre-installed attachment mechanisms, e.g., hooks, positioned throughout the data center.

The materials of the partition should be selected to provide thermal insulation properties to the partition. For example, the partition may comprise a plurality of thermal tiles that, e.g., reflect and/or absorb heat. Additionally, in embodiments, the partition may comprise a thermal cloth or fabric. Moreover, depending on embodiments, the materials of the partition may be flexible, such that the partition may be rolled-up.

Moreover, while the exemplary partition 230 as shown in FIG. 3 does not traverse the entire distance between the walls of the data center 205, it should be understood that, in embodiments, the partition may extend the entire distance between the walls of the data center 205. Moreover, while FIG. 3 only shows a single partition 230, the invention contemplates that any number of partitions may be used to, e.g., compartmentalize the data center 205, depending on a number of factors, including the thermal analysis of the data center, the size of the data center, the number of high-temperature sensitive computing resources in the data center, the locations of the high-temperature sensitive computing resources within the data center, the number of non-high-temperature sensitive computing resources, the locations of the non-high-temperature sensitive computing resources within the data center, the real-time load on the data center 205, a job schedule for the data center, and the time of day, amongst other factors.

HVAC Control

According to a further aspect of the invention, the HVAC control tool 45 may control the data center HVAC system 60 based on the determined thermal analysis and, in embodiments, the locations of the partitions. For example, after positioning a partition in the data center, the HVAC control tool 45 may dynamically alter air flow properties of the supplied air to different regions of the data center. More specifically, the HVAC control system 45 may dynamically alter air flow properties of the supplied air to different regions of the data center by, for example, selectively increasing or decreasing air flow rates to different regions of the data center, selectively increasing or decreasing air flow temperatures for different regions of the data center and/or selectively turning on or off air flows to different regions of the data center. It should be understood that the data center HVAC system 60 includes duct work, multiple air supply vents and diffusers. Additionally, it should be understood that the HVAC duct work, multiple air supply vents and diffusers may be in the ceiling of the data center, the walls of the data center (e.g., at different elevations on the walls) and/or the floors of the data center (e.g., within a sub floor wiring layer). Moreover, the data center may include temperature sensors 50 throughout the data center. Additionally, as discussed above, in embodiments, the temperature sensors 50 (e.g., thermometers) may be regularly-spaced throughout the data center or randomly-spaced throughout the data center to sense temperature and provide this information to the thermal analysis tool 30.

Furthermore, as discussed above, the data center may include computer resources that are to be maintained in a cooler environment and computer resources that can operate in higher temperature environments. Accordingly, the data center may have regions that should be maintained at cooler temperatures (for the computer resources that are to be maintained in a cooler environment) and may have regions that may not need as much cooling (for the computer resources that can operate in higher temperature environments).

Thus, referring to FIG. 3, in embodiments, the HVAC control tool 45 may instruct the HVAC system 60 of the data center, for example, to only supply the cold air flow 215 to the cooler region 235 of the data center 205, while cutting off a supply of cold air flow to the hotter region 240. Additionally, in embodiments, the HVAC control tool 45 may instruct the HVAC system 60, for example, to supply the cold air flow 215 to the cooler region 235 of the data center 205, while restricting a supply of cold air flow to the hotter region 240 to, e.g., twenty-five percent of the flow supplied to the cooler region 235. In embodiments, the HVAC control tool 45 may restrict or cut-off flow using the duct work, air supply vents and/or diffusers. For example, the HVAC control tool 45 may control the air supply vents, such that the air supply vents may be selectively fully-opened, fully-closed or anywhere between the fully-opened and fully-closed positions.

Additionally, in embodiments, the HVAC system 60 may be capable of concurrently supplying air of differing temperatures to the data center. For example, the HVAC system 60 may comprise a plurality of individually-controllable air conditioning units. Accordingly, the HVAC control tool 45 may, for example, instruct the HVAC system 60 to supply cooling air at different temperatures to the different regions (e.g., as a result of the dynamic placement of partitions) of the data center 205. For example, referring again to FIG. 3, the HVAC control tool 45 may direct the HVAC system 60 to supply air at a temperature of, e.g., 60° F. to the cooler region 235 and supply air at a temperature of, e.g., 80° F. to the hotter region 240.

Dynamic Partitioning and HVAC Control

The invention contemplates that the temperature distributions may change within the data center dynamically. For example, during the middle of the day, due to, e.g., heat from the sun, conditions may change within the data center. Additionally, computational loads on the computing resources in the data center may change, thus altering, for example, the amount of heat generated by the computing resources, and consequently, a previously determined overlaid thermal analysis.

As such, according to a further aspect of the invention, the thermal analysis tool 30 may perform updates to the thermal analysis and the mapping tool 35 may update the overlaid thermal analysis and may direct the partition control tool 40 to control the partition actuation system 55 and direct the HVAC control tool 45 to control the HVAC system 50 to account for the dynamically changing thermal conditions of the data center. For example, the thermal analysis tool 30 may perform the thermal analysis at a predetermined regular interval, e.g., every hour. It should be understood that the predetermined regular interval may be user configurable.

Additionally, conditions in the data center may trigger an updated thermal analysis by the thermal analysis tool 30, and subsequently, partition and HVAC control adjustments. For example, a temperature sensor 50 in the data center may sense a sudden change in temperature in a particular region of the data center. The thermal analysis tool 30 may detect the sudden change in temperature in a particular region of the data center, and consequently, trigger an update of the thermal analysis, and partition placement and/or HVAC control via the mapping tool 35, the partition control tool 40 and/or the HVAC control tool 45. In embodiments, an updated thermal analysis may be triggered by a change in temperature beyond a predetermined threshold, e.g., five degrees Fahrenheit or ten percent. Moreover, it should be understood that the predetermined threshold may be user-configurable.

Furthermore, a change in load, e.g., an increase in load, on the computing devices may trigger an updated thermal analysis. For example, in embodiments, the thermal analysis tool 30 may be configured to additionally detect real-time computational loads on the computing devices of the data center. Thus, according to an aspect of the invention, if the thermal analysis tool 30 detects a computational load increase, e.g., beyond a predetermined threshold, this may trigger an updated thermal analysis. That is, with an increase in computational loads on the computing devices of the data center, the thermal energy produced by the computing device may likewise increase. Thus, an increase in computational loads on the computing devices of the data center may then necessitate, for example, increased cooling in the data center and/or an additional partition, e.g., to section off a portion of the data center containing those computing devices that are now experiencing the increased computational loads.

Moreover, in embodiments, an updated thermal analysis may be manually directed. For example, a data center employee may perceive, e.g., an increase in temperature in a region of the data center. Accordingly, the employee may manually direct an updated thermal analysis and partition placement and/or HVAC control. As a further example, a data center employee may run an unscheduled job on computing devices of the data center. As the job is unscheduled, the thermal analysis tool 30 may initially be unaware of the impending increased computational load. However, the data center employee may know, e.g., based on the size of the impending unscheduled job, that running the job will alter the previous thermal analysis of the data center. Accordingly, the data center employee may manually direct an updated thermal analysis to account for the unscheduled job.

Flow Diagram

FIG. 4 shows an exemplary flow 400 for performing steps of the invention. The steps of the flow diagram described herein may be implemented in the environment of FIG. 1. The flow diagram may equally represent a high-level block diagram of the invention. The steps of the flow diagram may be implemented and executed from either a server, in a client server relationship, or they may run on a user workstation with operative information conveyed to the user workstation. Additionally, the invention can take the form of an entirely hardware embodiment, an entirely software embodiment or an embodiment containing both hardware and software elements. In an embodiment, the software elements include firmware, resident software, microcode, etc.

Furthermore, the invention can take the form of a computer program product accessible from a computer-usable or computer-readable medium providing program code for use by or in connection with a computer or any instruction execution system. The software and/or computer program product can be implemented in the environment of FIG. 1. For the purposes of this description, a computer-usable or computer readable medium can be any apparatus that can contain, store, communicate, propagate, or transport the program for use by or in connection with the instruction execution system, apparatus, or device. The medium can be an electronic, magnetic, optical, electromagnetic, infrared, or semiconductor system (or apparatus or device) or a propagation medium. Examples of a computer-readable medium include a semiconductor or solid state memory, magnetic tape, a removable computer diskette, a random access memory (RAM), a read-only memory (ROM), a rigid magnetic disk and an optical disk. Current examples of optical disks include compact disk-read only memory (CD-ROM), compact disc-read/write (CD-R/W) and DVD.

As shown in FIG. 4, at step 405 the thermal analysis tool performs a thermal analysis of the data center to determine the hot and cold regions of the data center. At step 410, the mapping tool overlays or transposes the thermal analysis over a map or physical layout of the data center's computing resources. At step 415, based on this information about the physical layout (which includes, e.g., information as to which computing resources are to be maintained in a cool environment and which computing resources are to be operate in a hotter environment, as described above) and data center thermal analysis, the partition control tool can dynamically reconfigure the walls, ceilings and/or floors to segment the hot spots from the colder regions of the data center. At step 420, the HVAC control tool dynamically controls the HVAC system to control, e.g., flow rates and or flow temperatures of the cold air flow.

At step 425, the thermal analysis tool determines if a predetermined time, e.g., a user-configurable regular interval, has expired. If, at step 425, the thermal analysis tool determines that the predetermined time has expired, then the process continues at step 405, where another thermal analysis is performed. A new or updated thermal analysis can be performed according to the a configuration of the partitions of the data center and modifications to the partitions and/or the HVAC system may be performed according to the new or updated thermal analysis of the data center.

If, at step 425, the thermal analysis tool determines that the predetermined time has not expired, then at step 430, the thermal analysis tool determines if a triggering event has occurred. If, at step 430, the thermal analysis tool determines that a triggering event has occurred, then the process continues at step 405, where another thermal analysis is performed. If, at step 430, the thermal analysis tool determines that a triggering event has not occurred, then at step 435, the thermal analysis tool determines whether there has been a manual direction for an updated thermal analysis. If, at step 435, the thermal analysis tool determines that a manual direction has occurred, then the process continues at step 405, where another thermal analysis is performed. If, at step 435, the thermal analysis tool determines that a manual direction has not occurred, then the process continues at step 425.

It should be understood, that while the steps have been described as occurring in a particular order, the invention contemplates that the steps may be performed in other orders. For example, step 430 may occur after step 435. Furthermore, the invention contemplates that, in embodiments, steps may be implied or omitted while still remaining true to this invention.

Moreover, while the invention has been described using the thermal analysis tool 30, the mapping tool 35, the partition control tool 40 and the HVAC control tool 45, the invention contemplates that any of the operations performed by the thermal analysis tool 30, the mapping tool 35, the partition control tool 40 and the HVAC control tool 45 may be combined into one as a combination of different tools depending on programming logic, or may be performed manually by a user (e.g., a data center employee). For example, in embodiments, a data center employee may manually control the partitions.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims, if applicable, are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated. Accordingly, while the invention has been described in terms of embodiments, those of skill in the art will recognize that the invention can be practiced with modifications and in the spirit and scope of the appended claims.

What is claimed is:

1. A computer program product comprising a computer readable hardware storage device having readable program code stored on the computer readable medium storage device, the program code comprising:
    program code to perform a thermal analysis of a data center by receiving temperatures from temperature sensors in the data center and accessing a job schedule to account for scheduled jobs throughout the data center;
    program code to update the thermal analysis of the data center by accounting for an unscheduled job;
    program code to overlay the updated thermal analysis on a map of the data center to provide an overlaid thermal analysis;
    program code to dynamically control an HVAC system based on the overlaid thermal analysis and a location of at least one partition in the data center, wherein the HVAC system is dynamically controllable to alter at least one of an air flow rate and an air flow temperature in the data center;
    program code to detect a change in temperature above a predetermined threshold in a specific region of the data center;
    program code to perform another update of the thermal analysis of the data center in response to the detected change in temperature being above the predetermined threshold in the specific region of the data center;
    program code to dynamically control the location of the at least one partition in the data center to be at a predetermined distance of the specific region of the data center based on the another update of the thermal analysis;
    program code to dynamically control the HVAC system to supply cooling air at a specific temperature in the specific region based on the location of the at least one partition in the data centers;
    program code to detect a plurality of real-time computational loads on a corresponding plurality of computing devices beyond a predetermined load threshold of the data center;
    program code to control adding another partition to section off a portion of the data center which comprises the corresponding plurality of computing devices of the data center in response to the plurality of real-time computational loads being beyond the predetermined load threshold; and
    program code to dynamically control the HVAC system to increase cooling in the portion of the data center which comprises the corresponding plurality of computing devices of the data center.

2. The computer program product of claim 1, further comprising:
    program code to update the thermal analysis and the overlaid thermal analysis after a predetermined time has expired; and
    program code to trigger a third update of the thermal analysis in response to the plurality of real-time computational loads being beyond the predetermined load threshold.

3. The computer program product of claim 1, wherein the at least one partition:
    comprises at least one of a wall partition, a ceiling partition and a floor partition composed of a thermally insulative material; and
    is at least one of retractable and structured and arranged to be rolled-up.

4. The computer program product of claim 1, further comprising program code to update the thermal analysis and the overlaid thermal analysis upon occurrence of a triggering event or a manual direction, and the another partition comprises a plurality of thermal tiles that absorb heat.

5. The computer program product of claim 4, wherein the triggering event comprises:
    a temperature change in the data center beyond the predetermined threshold; and
    a computational resource usage change in the data center.

6. The computer program product of claim 5, wherein the map of the data center comprises:

a physical layout of computing resources of the data center; and an indication of a portion of the computing resources that is to be maintained in a cool environment.

7. The computer program product of claim 1, wherein the map of the data center comprises:

an indication of a portion of computing resources of the data center that is to operate in higher temperature environments; and a real-time indication of the computing resources that are currently operating.

8. The computer program product of claim 7, further comprising program code to determine whether to dynamically control the at least one partition based on the overlaid thermal analysis, and the HVAC system comprises a plurality of individually-controllable air conditioning units.

9. The computer program product of claim 8, further comprising program code to update the thermal analysis of the data center to account for an unscheduled job which increases a computational load within the data center.

10. A method implemented in a computer infrastructure using computer executable code on a computer readable medium, comprising:

performing, by a computer processor, a thermal analysis of a data center to identify cooler regions of the data center and hotter regions of the data center by accessing a job schedule to account for scheduled jobs throughout the data center which increase a computational load of different computing resources of the data center;

updating the thermal analysis of the data center by accounting for an unscheduled job;

overlaying, by the computer processor, the updated thermal analysis on a map of the data center to provide an overlaid thermal analysis which correlates the cooler regions of the data center and the hotter regions of the data center with computational resources of the data center;

dynamically controlling, by the computer processor, an HVAC system based on the overlaid thermal analysis and a location of at least one partition in the data center to concentrate an air flow to locations of the scheduled jobs and the unscheduled job within the data center;

detecting, by the computer processor, a change in temperature above a predetermined threshold in a specific region of the data center;

performing, by the computer processor, another update of the thermal analysis of the data center in response to the detected change in temperature being above the predetermined threshold in the specific region of the data center;

dynamically controlling, by the computer processor, the location of the at least one partition in the data center to be at a predetermined distance of the specific region of the data center based on the another update of the thermal analysis;

dynamically controlling, by the computer processor, the HVAC system to supply cooling air at a specific temperature in the specific region based on the location of the at least one partition in the data center;

detecting a plurality of real-time computational loads on a corresponding plurality of computing devices beyond a predetermined load threshold of the data center;

controlling adding another partition to section off a portion of the data center which comprises the corresponding plurality of computing devices of the data center in response to the plurality of real-time computational loads being beyond the predetermined load threshold; and dynamically controlling the HVAC system to increase cooling in the portion of the data center which comprises the corresponding plurality of computing devices of the data center, wherein the HVAC system comprises a plurality of individually-controllable air conditioning units.

11. The method of claim 10, further comprising:

updating, by the computer processor, the thermal analysis and the overlaid thermal analysis after a predetermined time has expired; and triggering, by the computer processor, a third update of the thermal analysis in response to the plurality of real-time computational loads being beyond the predetermined load threshold.

12. The method of claim 10, wherein the performing the thermal analysis comprises receiving real-time temperature readings from at least one temperature sensor in the data center.

13. The method of claim 12, wherein the performing the thermal analysis comprises determining average temperatures for regions of the data center based on the real-time temperature readings.

14. The method of claim 12, wherein the performing the thermal analysis comprises determining air flow paths in the data center.

15. The method of claim 14, wherein the map of the data center comprises:

a physical layout of computing resources of the data center; and an indication of a portion of the computing resources that is to be maintained in a cool environment.

16. The method of claim 10, wherein the map of the data center comprises:

an indication of a portion of the computing resources that is to operate in higher temperature environments; and a real-time indication of computing resources of the data center that are currently operating.

17. The method of claim 10, further comprising updating the thermal analysis and the overlaid thermal analysis upon occurrence of a triggering event or a manual direction, and the another partition comprises a plurality of thermal tiles that absorb heat.

18. The method of claim 17, wherein the triggering event comprises:

a temperature change in the data center beyond the predetermined threshold; and a computational resource usage change in the data center.

19. The method of claim 10, wherein the HVAC system is dynamically controllable to alter at least one of an air flow rate and an air flow temperature in the data center.

20. The computer program product of claim 9, wherein the location of the at least one partition depends on the thermal analysis of the data center, a size of the data center, a number of high-temperature sensitive computing resources in the data center, locations of the high-temperature sensitive computing resources within the data center, a number of non-high-temperature sensitive computing resources, locations of the non-high-temperature sensitive computing resources within the data center, a real-time load on the data center and a time of day.

* * * * *